(12) United States Patent
Jin et al.

(10) Patent No.: US 6,392,286 B1
(45) Date of Patent: May 21, 2002

(54) SEMICONDUCTOR CHIP PACKAGING SYSTEM AND A SEMICONDUCTOR CHIP PACKAGING METHOD USING THE SAME

(75) Inventors: Ho-Tae Jin; Heui-Seong Kim; Sang-Young Kim, all of Cheonan (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/632,079

(22) Filed: Aug. 2, 2000

(30) Foreign Application Priority Data

Aug. 20, 1999 (KR) .............................................. 99-31717

(51) Int. Cl.⁷ .............................................. H01L 21/44
(52) U.S. Cl. ...................................... 257/660; 257/676
(58) Field of Search ................................ 257/660, 676, 257/682, 735, 784, 686, 723, 727, 777, 783, 792

(56) References Cited

U.S. PATENT DOCUMENTS

| | | | |
|---|---|---|---|
| 4,740,247 A | * 4/1988 | Hayes et al. .................. 134/42 |
| 5,564,159 A | * 10/1996 | Triber .......................... 15/302 |
| 5,663,593 A | 9/1997 | Mostafazadeh et al. ...... 257/666 |
| 5,677,569 A | * 10/1997 | Takashima et al. .......... 257/686 |
| 5,706,178 A | 1/1998 | Barrow ......................... 361/777 |
| 5,708,567 A | 1/1998 | Shim et al. ................... 361/723 |
| 5,712,570 A | * 1/1998 | Heo et al. ..................... 324/538 |
| 5,729,050 A | 3/1998 | Kim ............................. 257/667 |
| 5,741,729 A | 4/1998 | Selna ........................... 438/125 |
| 5,748,450 A | 5/1998 | Kim et al. .................... 361/777 |
| 5,783,220 A | * 7/1998 | Osada et al. ................. 425/116 |
| 5,796,170 A | 8/1998 | Marcantonio ................ 257/786 |
| 5,821,613 A | * 10/1998 | Takashima et al. .......... 257/676 |
| 6,072,233 A | * 6/2000 | Corisis et al. ............... 257/686 |

* cited by examiner

Primary Examiner—David Nelms
Assistant Examiner—Phuc T. Dang
(74) Attorney, Agent, or Firm—Skjerven Morrill MacPherson LLP; David W. Heid (57) ABSTRACT

The present invention uses an ultraviolet ray to clean PCBs in packaging semiconductors, instead of using a plasma gas. Since the ultraviolet ray cleaning does not require a vacuum condition around an ultraviolet ray lamp, a guide belt for conveying the PCBs can be freely installed in such a manner that an ultraviolet ray cleaning tool and fabricating equipment are arranged in-line. This results in an in-line arrangement of an ultraviolet ray cleaning chamber and the fabricating equipment. Therefore, the PCBs can be introduced into fabricating processes immediately after cleaning and a long standby time problem of the PCB outside of the fabricating equipment is solved.

23 Claims, 4 Drawing Sheets

SEMICONDUCTOR CHIP PACKAGING SYSTEM AND A SEMICONDUCTOR CHIP PACKAGING METHOD USING THE SAME

BACKGROUND OF THE INVENTION

1. Field of the Invention

The present invention relates to a system for packaging a semiconductor chip as a ball grid array (BGA) type or a fine pitch ball grid array (FBGA) type. More particularly, the semiconductor chip packaging system provides an improved cleaning technology of a printed circuit board (PCB) on which the semiconductor chips are mounted and allows in-line arrangement of cleaning equipment and fabricating equipment. Through the in-line arrangement, PCBs can be introduced into the fabricating equipment immediately after finished in the cleaning equipment, whereby the cleaned state of the PCBs can be maintained longer. Furthermore, the present invention relates to a semiconductor chip packaging method using the semiconductor chip packaging system.

2. Description of the Related Art

As the memory capacities of electronic and information devices are enlarged, semiconductor chips such as DRAM and SRAM have trended highly integrated. Accordingly, the sizes of the semiconductor chips are also enlarged. Contrary to the trend of the large semiconductor chips, packaging technologies take a trend of making semiconductor chip package lighter, thinner, simpler and smaller depending on the miniaturization and lightness of the electronic and information devices.

Recently, with rapid developments of semiconductor chip packaging technology, surface mounted semiconductor packages such as BGA semiconductor packages which are capable of accommodating far larger semiconductor chips and have a size reduced to a minimum have been developed. With repetition of developments in the technology, the sizes of semiconductor packages, e.g., a chip scale semiconductor package such as a FBGA semiconductor package, are close to 120% of the size of a semiconductor chip.

Such conventional BGA semiconductor package structures are disclosed in detail in U.S. Pat. No. 5,663,593 entitled "Ball grid array package with lead frame", U.S. Pat. No. 5,706,178 entitled "Ball grid array integrated circuit package that has vias located within the solder pads of a package", U.S. Pat. No. 5,708,567 entitled "Ball grid array semiconductor package with ring-type heat sink", U.S. Pat. No. 5,720,050 entitled "Semiconductor package substrate and ball grid array semiconductor package using same", U.S. Pat. No. 5,741,729 entitled "Ball grid array package for an integrated circuit", U.S. Pat. No. 5,748,450 entitled "BGA package using a dummy ball and a repairing method thereof", U.S. Pat. No. 5,796,170 entitled "Ball grid array integrated circuit packages" and so on.

Generally, the conventional semiconductor packages such as a duel inline package (DIP) type semiconductor package and a small outline J-leaded package (SOJ) type semiconductor package make an electrical connection between semiconductor chips and external devices using lead frames. On the other hand, the BGA semiconductor packages and the FBGA semiconductor packages use a substantially different member, e.g., a PCB, instead of the lead frame.

Generally, the PCBs used in the BGA and FBGA semiconductor packages are coated with photo solder resist (PSR).

However, there are several serious problems in using the BGA and FBGA semiconductor packages in the fabrication line, The problems will be described hereinafter.

As described above, the BGA and FBGA semiconductor packages make electrical connection between semiconductor chips and external devices using a PCB that is substantially different from the lead frame.

However, since, differently from the conventional lead frame, the PCB has a structure that is coated with PSR on the surface thereof, the PCB absorbs moisture too soon and is easily transformed. Moreover, the PCB is easily contaminated by outer contamination sources.

In the case that the semiconductor chips are mounted on the PCB under the condition that the PCB suffers from the above-described problems, a finally completed BGA or FBGA semiconductor package may have problems in that semiconductor chips are separated from the PCB, wires are separated from leads of the PCB, or molded objects may be separated from the PCB. These problems result in the degeneration in performance of electronic devices with the semiconductor packages.

In order to prevent the above described problems, plasma cleaning processes are performed to remove both of the moisture within the PCB and contamination materials on the surface of the PCB at mid time of the whole semiconductor assembly process, e.g., before die attaching process, before wire bonding process and before molding process.

In this case, the PCB is introduced into a chamber filled with a plasma gas before a subsequent process is performed. The PCB is then exposed to the plasma gas such that the contamination materials on the PCB reacts on the plasma gas. As a result, the moisture within the PCB and the contamination materials attached to the surface of the PCB are removed.

For example, right before die attaching process is performed, an operator manually introduces the PCB into the plasma chamber. After the plasma cleaning process is completed, the operator manually takes out the PCB from the chamber. This process is repeatedly performed. PCBs unloaded from the chambers through the aforementioned process, are collected in a lot number and the operator loads the collected PCBs to die attaching equipment at a time so that the die attaching process can be rapidly performed.

Usually, the plasma cleaning effects lasts 4 to 6 hours. Accordingly, special attention should be payed on loading the PCBs to another process within 4 to 6 hours since the plasma cleaning process has been completed in the conventional fabrication line.

Usually, the plasma cleaning effects last 4 to 6 hours. Accordingly, special attention should be paid on loading the PCBs to another process within 4 to 6 hours since the plasma cleaning process has been completed in the conventional fabrication line.

This is because the PCBs are not loaded to the subsequent assembly process according to the processed order of the PCBs immediately after the cleaning process but the PCBs are held in an air environment outside the assembly equipment until the PCBs are completely collected from the plurality of chambers.

Thus, initially collected PCBs are held for a long time outside the assembly equipment until remaining PCBs are collected. Finally, a great amount of time difference, e.g., more than 6 hours, occurs between the cleaning step and the substantial assembly process.

In the event that the PCBs are loaded to the assembly process after more than 6 hours when the cleaning effect is completely disappeared, PCBs still suffer from the moisture and contamination problems.

Moreover, since a large part of the PCB cleaning process is manually performed by an operator, standby time of the PCB is increased.

In order to prevent such problems in advance, the PCBs should be introduced into the assembly process immediately after the cleaning process. However, the immediate introduction of the cleaned PCBs requires an extra operator in charge of the job. This results in reduced production efficiency.

In the meanwhile, if in-line arrangement of the plasma cleaning chamber and the assembly equipment is realized, these problems can be solved. However, the chamber should be airtight and the inside of the chamber should be under high vacuum condition for the plasma process. Accordingly, in-line arrangement of the cleaning chamber and the fabricating equipment is actually impossible.

Therefore, though the problems of the prior art are thoroughly understood, clean solution cannot be found in the prior art.

SUMMARY OF THE INVENTION

It is therefore an object of the present invention to load a PCB into the assembly equipment immediately after the cleaning step of the PCB has been completed by improving PCB cleaning technology and thereby to arrange the cleaning equipment and the fabricating equipment in-line.

It is another object of the present invention to maintain the cleaned state of the PCB longer by reducing the time difference between the cleaning step and the assembly step of the PCB.

It is another object of the present invention to overcome the problems that the PCB absorbs the moisture too soon and it is easily contaminated by outer contamination sources by maintaining the cleaned state of the PCB longer.

It is another object of the present invention to overcome the problems that semiconductor chips are separated from the PCB, wires are separated from leads of the PCB, and molded objects are separated from the PCB in advance by maintaining the cleaned state and suppressing occurrence of the PCB problems.

It is another object of the present invention to sharply enhance entire process efficiency by removing manual work of an operator in the PCB cleaning process. It is another object of the present invention to maintain normal performance of an electronic device with the semiconductor package.

The other objects of the present invention will be more clearly provided by detailed description of the present invention and the accompanying drawings.

These and other objects are provided, according to the present invention, by cleaning the PCB using an ultraviolet ray instead of the plasma gas, which is substantially different from the prior art.

In order to perform the cleaning process using the ultraviolet ray, the present invention provides a special semiconductor chip packaging system in a semiconductor fabrication area. The semiconductor chip packaging system includes assembly equipments for assembling semiconductor chips and PCBs according to a series of assembly order, and an ultraviolet ray cleaning tool. Each of the assembly equipments includes a loading part and a unloading part. The ultraviolet ray cleaning tool is in-line arranged in the loading part, automatically conveys the PCB, supplies the PCB with an ultraviolet ray to remove contamination materials on the PCB, and loads the contamination material removed PCB on the loading part.

The ultraviolet ray cleaning tool is connected to the loading part of the assembly equipments, and includes a guide belt for conveying the PCB to the loading part of the assembly equipments and an ultraviolet ray lamp arranged over the guide belt, for supplying the PCB with an ultraviolet ray.

In the case that a plasma gas is used in PCB cleaning as in prior art, the space in the chamber requires vacuum condition. Accordingly, though various problem occurrence is thoroughly understood, the in-line arrangement of the plasma cleaning chamber and the assembly equipments cannot be actually realized.

However, in the case that an ultraviolet ray is used in PCB cleaning as in the present invention, the environment around the ultraviolet ray lamp does not need to be under vacuum condition. Accordingly, the guide belt for connecting the ultraviolet ray cleaning tool to the assembly equipment in-line can be freely installed. This results in an in-line arrangement of the ultraviolet ray cleaning tool and the assembly equipment. In this case, cleaned PCBs can be conveyed along the guide belt and introduced into the assembly equipment immediately after cleaned. Thereby, the long [time standy] standby time problem of PCBs outside of the assembly equipment can be solved.

In the present invention, since the ultraviolet ray cleaning chamber and the assembly equipment are arranged in-line by means of the guide belt, cleaned PCBs can be automatically conveyed and loaded to the assembly equipments. Therefore, an extra operator for the cleaning process is not needed.

In the case that the above-described present invention is realized, the time difference between the cleaning step and the assembly step of the PCB is considerably reduced. Therefore, the cleaned state of the PCB can be maintained longer and essential problems of the PCB, i.e., rapid moisture absorption problem and contamination problem can be easily solved.

By enhancing the performance of the PCB through this process, the problems of delamination of semiconductor chips from the PCB, delamination of wires from leads of the PCB and delamination of molded objects from the PCB can be accordingly solved.

BRIEF DESCRIPTION OF THE DRAWINGS

The advantages of the present invention will become more apparent by describing embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown.

This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
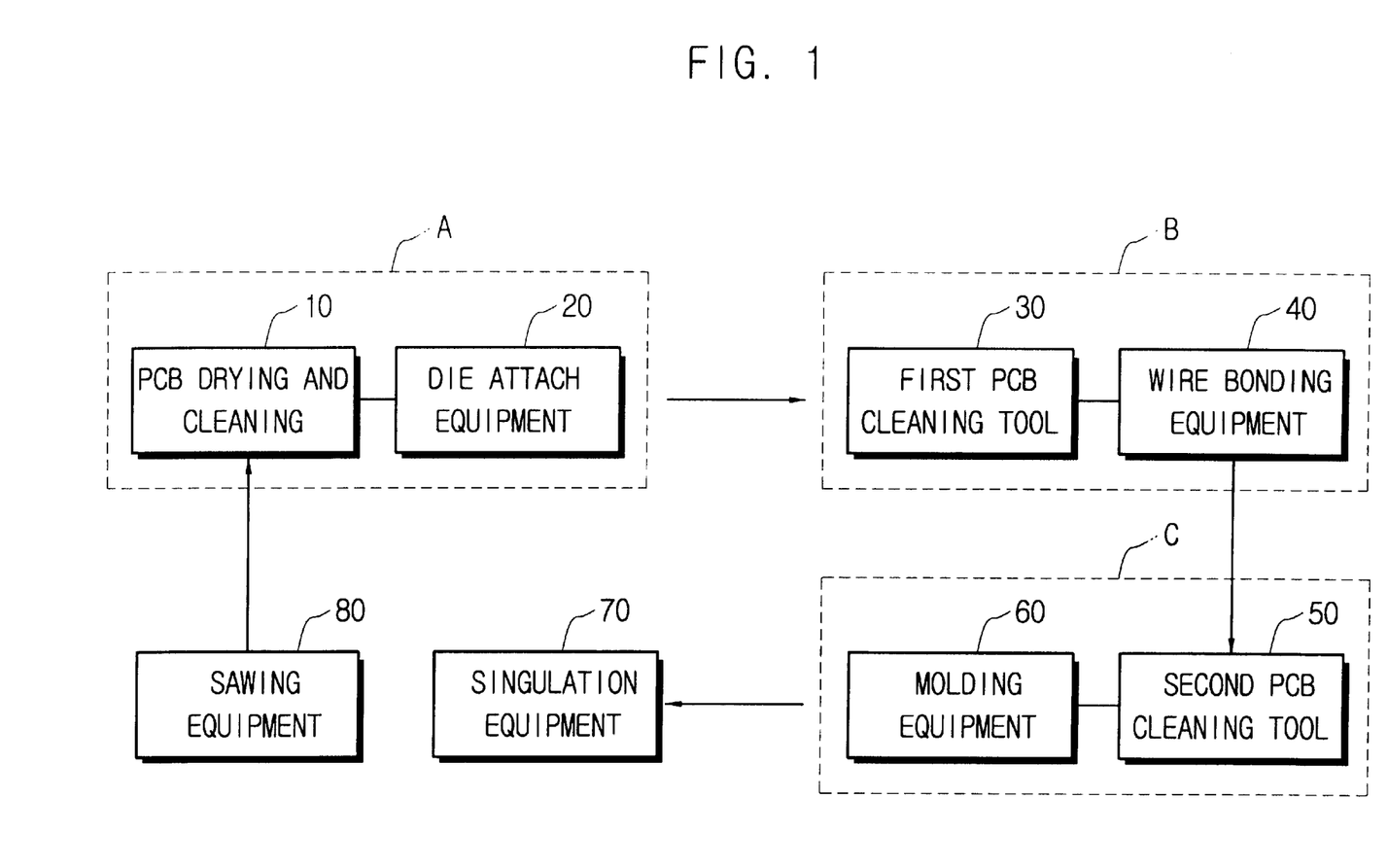
FIG. 1 is a block diagram of a semiconductor chip packaging system applied to preferred embodiments of the present invention.

As shown in FIG. 1, a pre-treatment process, e.g., a sawing process is performed before a substantial semiconductor assembly process is performed. In this a case, a sawing equipment 80 moves a blade arranged above a wafer downwardly and rotates the blade at a high speed so that the semiconductor chips arranged on the wafer can be individually separated.

After the sawing process has been completed, substantial assembly processes, e.g., a die attaching process, a wire bonding process and a molding process are performed in order in a production line.

At this time, as shown in FIG. 1, a die attaching equipment 20 for the die attaching process, a wire bonding equipment 40 for the wire bonding process and a molding equipment 60 for the molding process are respectively disposed in areas A, B and C of the production line. In this case, a PCB drying and cleaning tool 10, a first PCB cleaning tool 30 and a second PCB cleaning tool 50 are respectively installed near the die attach equipment 20, the wire bonding equipment 40 and the molding equipment 60 in the in-line type. This is the structure of the semiconductor chip packaging system according to the embodiments of the present invention.

Figure 2:
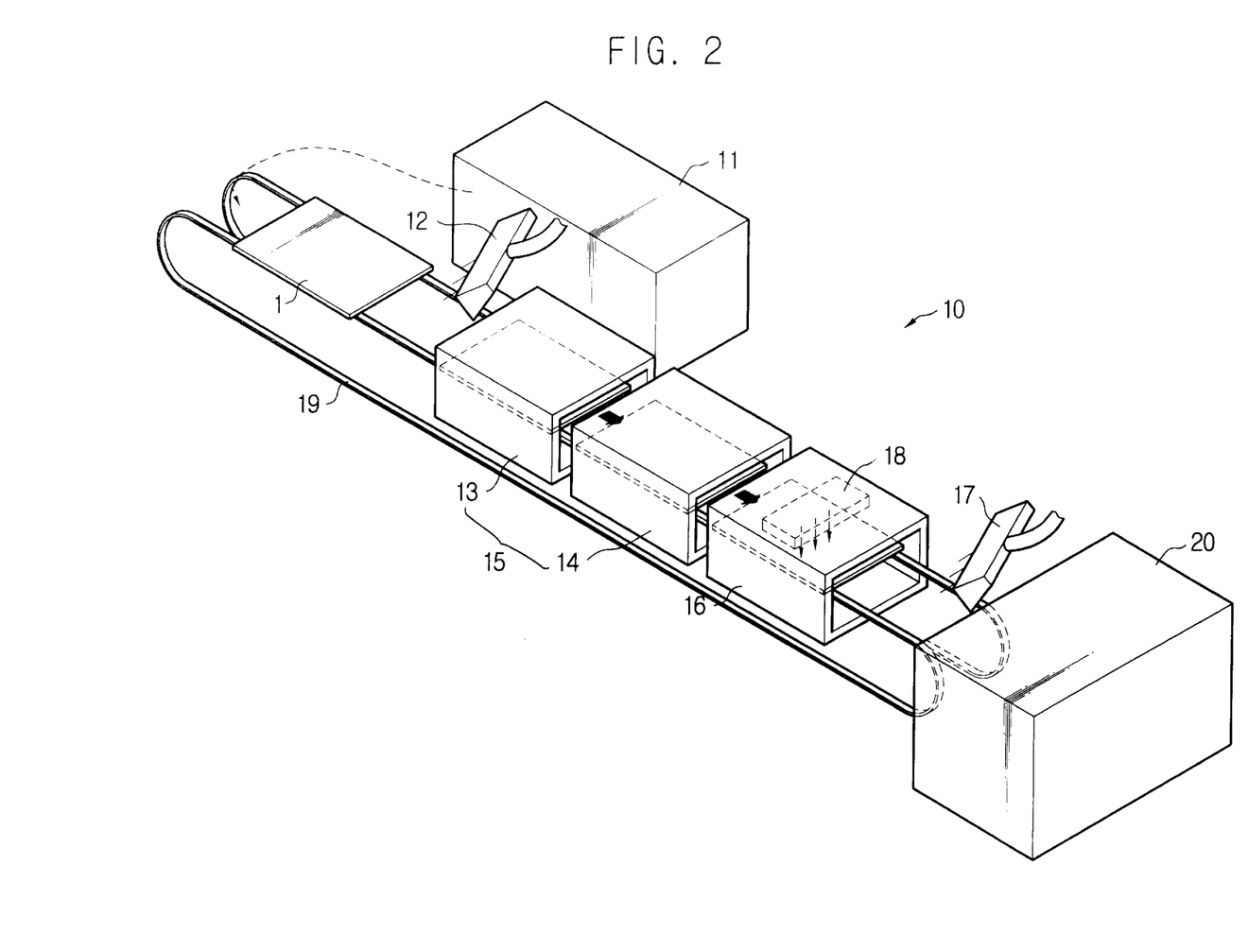
FIG. 2 is a perspective view of a semiconductor chip packaging system according to one preferred embodiment of the present invention.

The semiconductor chip packaging system according to one preferred embodiment of the present invention arranged in the area A of FIG. 1 is shown in FIG. 2.

Referring to FIG. 2, the packaging system includes: a die attaching equipment 20 including a loading part and an unloading part, for die-attaching semiconductor chips to a PCB; and a PCB drying and cleaning tool 10 arranged in the loading part of the die attaching equipment 20 in in-line type.

At this time, the PCB drying and cleaning tool 10 automatically conveys the PCB, supplies the PCB with a predetermined amount of heat to remove a moisture component existing in the PCB, supplies the PCB with an ultraviolet ray to remove contamination materials in the PCB, and loads the moisture component- and contamination material-removed PCB to the loading part of the die attaching equipment 20.

As shown in FIG. 2, the PCB drying and cleaning tool 10 includes: a guide belt 19; a dry housing 15 arranged at a predetermined position on the guide belt 19; and a lamp housing 16 arranged at the rear of the dry housing 15.

The guide belt 19 has an end connected to the loading part of the die attaching equipment 20 and conveys a PCB 1 to the loading part of the die attaching equipment 20.

The dry housing 15 is arranged at a predetermined position on the guide belt 19, for example, near an input port, supplies the PCB 1 with a predetermined amount of heat to remove the moisture component in the PCB 1.

According to features of the present invention, the dry housing 15 includes: a first dry housing 13; and a second dry housing 14 spaced apart from the first dry housing 13.

A predetermined sized room is defined in each of the first and second dry housings 13 and 14. For example, the first and second dry housings 13 and 14 have, for example, a box-shaped rectangular frame and have opened front and back sides so that the guide belt 19 can be passed therethrough.

The first and second dry housings 13 and 14 supplies the PCB 1 with a predetermined amount of heat to remove moisture component in the PCB 1 when the PCB 1 is conveyed by the guide belt 19 and stays therein.

On the other hand, the lamp housing 16 is arranged at the rear of the dry housing 15 on a predetermined position of the guide belt 19. In this case, the lamp housing 16 has, for example, a box-shaped rectangular frame so that a predetermined sized room can be defined therein and has opened front and back sides so that the guide belt 19 can pass therethrough which is similar with the dry housing 15.

On the upper side of the lamp housing 16, an ultraviolet ray lamp 18 for radiating an ultraviolet ray is installed. Under the condition, the lamp 18 supplies the PCB 1 with an ultraviolet ray to remove the contamination materials on the PCB 1 when the PCB 1 is conveyed by the guide belt 19 and stays in the room of the lamp housing 16.

As shown in the drawing, a cleaning air fan 12 is further arranged over the guide belt 19 in the front of the dry housing 15. The cleaning air fan 12 supplies the PCB 1 with a cleaning air, for example, $N_2$, for a predetermined amount of time so that particles and burrs on the PCB 1 can be removed in advance right before the PCB 1 is introduced into the dry housing 15. In this case, since the PCB 1 is fundamentally cleaned in advance, more stable cleaning state can be ensured when the following ultraviolet ray cleaning process is completed.

At an opposed position to the cleaning air fan 12, for example, over the guide belt 19 at the rear of the lamp housing 16, a cooling air fan 17 is further arranged. The cooling air fan 17 supplies the PCB 1 with a cooling air, e.g., $N_2$, for a predetermined amount of time in order to cool the PCB 1 right before the PCB 1 is loaded on the die attaching equipment 20. In this case, since the surface of the PCB 1 is rapidly cooled by the supplied cooling air, normal temperature state of the PCB 1 can be maintained even though the PCB 1 is subject to the drying process and the ultraviolet ray cleaning process and exposed to a high temperature environment.

Now, the semiconductor chip packaging method using the semiconductor chip packaging system according to a first embodiment of the present invention will be described.

First, in the production line, before the semiconductor chips which are individually separated from a wafer through a sawing process are loaded on the die attaching equipment 20, the PCB 1 is unloaded from a PCB stacker 11 and loaded onto the guide belt 19. In this case, the guide belt 19 is rotated at a predetermined speed by operation of a driving unit (not shown). Then, the PCB 1 on the guide belt 19 is rapidly conveyed toward the die attaching equipment 20.

When the PCB 1 arrives under the cleaning air fan 12, the operation of the driving unit is stopped to hold the PCB 1 under the cleaning air fan 12.

Under this condition, the second dry housing 14 performs a second drying process in such a manner that a heat having the temperature range of 100° C. to 170° C. is supplied to the PCB 1 again and thereby the moisture in the PCB 1 is perfectly removed. The second drying process is performed, for example, for 2 minutes and 50 seconds to 10 minutes. Through the second drying process by the second dry housing 14 as well as the first drying process by the first dry housing 13, the moisture of the PCB 1 can be perfectly removed. Therefore, the PCB 1 will not be transformed by the moisture even when completely fabricated and finally mounted on an electronic device.

When the air cleaning process is completed, the driving unit is operated again to rotate the guide belt 19. Then, the PCB 1 on the guide belt 19 is rapidly conveyed toward the die attaching equipment 20.

The PCB 1 is stopped in the first dry housing 13 by stopping the operation of the driving unit.

Under this condition, the first dry housing 13 performs a first drying process in such a manner that a heat having the temperature range of 100° C. to 170° C. is supplied to the PCB 1 and thereby the moisture in the PCB 1 is rapidly removed. The first drying process is performed, for example, for 2 minutes and 50 seconds to 10 minutes. Through the first drying process by the first dry housing 13, the moisture of the PCB 1 can be mostly removed. Therefore, the PCB 1 will not be transformed by the moisture even when completely fabricated and finally mounted on an electronic device.

After the first drying process is completed by the first dry housing 13, the guide belt 19 is rotated again and the PCB 1 on the guide belt 19 is moved toward the die attaching equipment 20.

The PCB 1 is stopped in the second dry housing 14 by stopping the driving unit in the production line.

Under this condition, the second dry housing 14 performs a second drying process in such a manner that a heat having the temperature range of 100° C. to 170° C. is supplied to the PCB 1 again and thereby the moisture in the PCB 1 is perfectly removed. The second drying process is performed, for example, for 2 minutes and 50 seconds to 10 minutes. Through the second drying process by the second dry housing 13 as well as the first drying process by the first dry housing 13, the moisture of the PCB 1 can be perfectly removed. Therefore, the PCT 1 will not be transformed by the moisture even when completely fabricated and finally mounted on an electronic device.

In brief, the present invention provides a cleaning process by a cleaning air fan 12 and drying process by the first and second dry housings 13 and 14 for 5 to 20 minutes so that moisture as well as particles and burrs in the PCB 1 can be removed.

On the other hand, when the first and second drying processes are completed, the driving unit is operated again to rotate the guide belt 19. Then, the PCB 1 on the guide belt 19 is moved toward the die attaching equipment 20.

When the PCT 1 arrives in the lamp housing 16, the driving unit is stopped again. Then, the PCB 1 is stopped in the lamp housing 16.

Under this condition, the lamp housing 16 performs an ultraviolet ray cleaning process in such a manner that an ultraviolet ray is irradiated to the PCB 1 from the lamp 18, for example, for 1 to 2 minutes. Then, the contamination materials on the PCB 1 can be entirely removed. Therefore, when the semiconductor chip assembly is completed through the following processes, problems such as delamination of semiconductor chips and wires and delamination of molded objects from the PCB 1 can be prevented.

Moreover, since the PCB 1 has been fundamentally cleaned by the cleaning air fan 12, more stable cleaning state of the PCB 1 can be ensured when the ultraviolet ray cleaning process is completed.

The ultraviolet ray used in the ultraviolet ray cleaning process has a wavelength corresponding to, for example, $\frac{1}{3}$ of a visible ray, and an intensity of 70 $mmJ/cm^9$ to 90 $mmJ/cm^2$.

As described above, even though various problems of the conventional plasma cleaning process are thoroughly understood, the plasma cleaning chamber and fabricating equipment cannot be actually arranged in-line since the plasma cleaning process requires a vacuum condition.

On the other hand, the present invention uses an ultraviolet ray in the PCB cleaning process. Accordingly, it is not necessary to maintain the process condition as vacuum state and the PCB drying and cleaning tool 10 and the die attaching equipment 20 can be installed wherever on the guide belt 19 as shown in the drawing. This means that an in-line arrangement of the PCB drying and cleaning tool 10 and the die attaching equipment 20 is realized.

When the ultraviolet ray cleaning process is completed, the operation of the driving unit is restarted in the production line and the guide belt 19 is accordingly rotated again. Then, the PCB 1 on the guide belt 19 is rapidly moved toward the die attaching equipment 20.

The PCB 1 is then stopped under the cooling air fan 17 by stopping the operation of the driving unit.

Under this condition, the cooling air fan 17 performs an air cooling process in such a manner that a cooling air, for example, $N_2$ is supplied to the PCB for a predetermined time, for example, for 30 to 60 seconds. Then, the PCB 1 is cooled. In this case, since the surface of the PCB 1 is rapidly cooled by the supplied cooling air, the temperature of the PCB 1 can immediately return to the normal condition even when exposed to a high temperature environment of the drying process and the ultraviolet ray cleaning process.

On completion of the cooling process, the driving unit is operated again and the guide belt 19 is accordingly rotated so that the PCB 1 on the guide belt 19 is safely loaded on the loading part of the die attaching equipment 20.

At this time, since the PCB drying and cleaning tool 10 and the die attaching equipment 20 are arranged in-line according to the present invention, the PCBs 1 on the guide belt 19 can be immediately introduced into the die attaching process after cleaned. Therefore, the problems caused by long standby time of the PCB at the outside of the die attaching equipment 20 can be overcome.

Accordingly, time difference between cleaning and die attaching is considerably reduced and the cleaned state of the PCB 1 can be kept longer after cleaned. As a result, the problems of the PCB 1, i.e., rapid moisture absorption problem and easy contamination problem can be easily solved.

Moreover, in the case that the present invention is accomplished, the cleaned PCB 1 can be automatically conveyed and loaded on the die attaching equipment 20. As a result, an extra operator in charge of the cleaning process is not necessary.

In general, the contaminated level is determined by dropping water onto the surface of the PCB 1 and measuring a contact angle of the water drop and the surface of the PCT 1. At this time, the larger contact angle means the more serious contaminated PCB.

The measured results after a conventional plasma cleaning process and an ultraviolet ray cleaning process according to the present invention are presented in Table 1.

TABLE 1

|  | 5 | 6 | 7 | 8 | 9 | 10 | 11 | 12 |
|---|---|---|---|---|---|---|---|---|
| Conventional plasma cleaning | 35.2 | 38.4 | 39.3 | 40.2 | 41.5 | 40.7 | 42.3 | 40.1 |
| Ultraviolet ray cleaning | 26.7 | 27.5 | 31.2 | 31.4 | 32.6 | 30.8 | 28.9 | 27.5 |

In Table 1, the numbers 5 to 12 are the lengths of the PCB 1 expressed in centimeter and the values 35.2, 38.4, . . . , 40.1 and 28.7, 27.5 . . . , 27.5 are the contact angles of the surface of the PCBs 1 and the water drops on the respective PCBs 1.

As shown in Table 1, while the contact angles due to the conventional plasma cleaning process are at a high level ranged from 35.2 degrees to 42.3 degrees, the contact angles due to the ultraviolet ray cleaning process according to the present invention are at a low level ranged from 27.5 degrees to 32.6 degrees.

Based on the result, it can be concluded that more stable cleaned state of PCB can be obtained by the present invention.

Continuously, the die attaching equipment 20 attaches the semiconductor chips individually separated through the sawing process to die pads of the PCB 1. Thereafter, the die-attached PCBs 1 are loaded to a PCB magazine and transferred to a wire bonding process.

Figure 3:
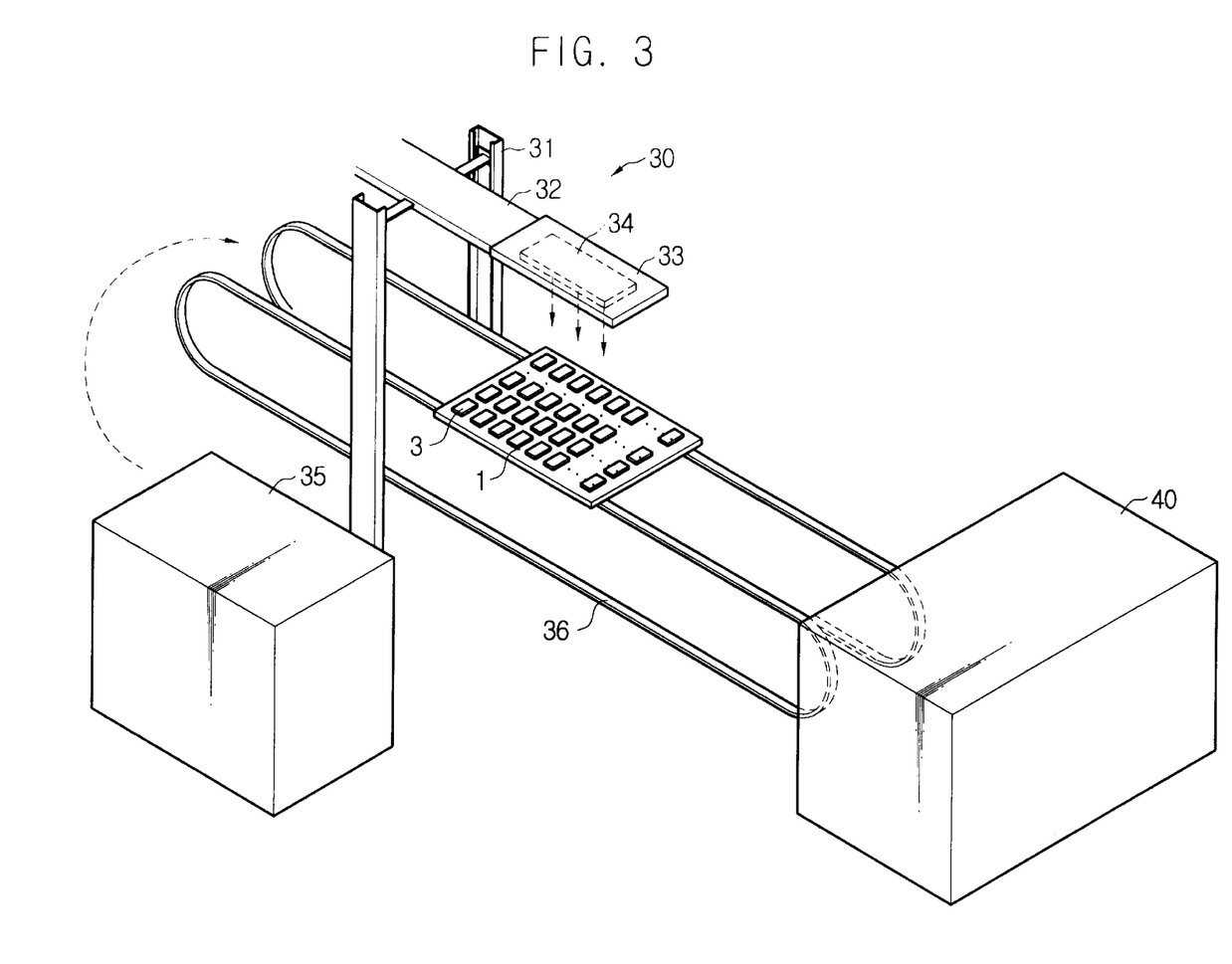
FIG. 3 is a perspective view of a semiconductor chip packaging system according to another preferred embodiment of the present invention.

On the other hand, the semiconductor chip packaging system arranged in the area B (FIG. 1) of the fabrication line according to another preferred embodiment of the present invention includes: a wire bonding equipment 40 including a loading part and an unloading part, for electrically connecting bonding pads of the die-attached semiconductor chips 3 to leads of the PCB 1; and a first PCB cleaning tool 30 arranged in the loading part of the wire bonding equipment 40 in-line, as shown in FIG. 3.

The first cleaning tool 30 automatically transfers the PCB 1, supplies the PCB 1 with an ultraviolet ray to remove contamination materials on the PCB 1, and loads the contamination material-removed PCB 1 to the loading part of the wire bonding equipment 40.

As shown in the drawing, the first cleaning tool 30 includes a guide belt 36 and an ultraviolet ray lamp 34 installed over the guide belt 36.

The guide belt 36 has an end connected to the loading part of the wire bonding equipment 40 and conveys the die attached PCB 1 to the loading part of the wire bonding equipment 40.

The ultraviolet ray lamp 34 is installed at a predetermined position over the guide belt 36, for example, over the central portion of the guide belt 36 and supplies an ultraviolet ray to the PCB 1 when the PCB 1 on the guide belt 36 is conveyed and stopped under the lamp 34 for a predetermined time to remove the contamination materials on the PCB 1.

As shown in the drawing, the ultraviolet ray lamp 34 is installed in a lamp box 33 arranged over the guide belt 36. The lamp box 33 is supported by a support bar 32 and mounted onto an up and down guide bar 31. Accordingly, the lamp box 33 can be moved up and down along the up and down guide bar 31. In this case, the guide belt 36 is extended under the lamp box 33.

Since there is no space around the wire bonding equipment 40 enough to install another structure, it is desirable that the ultraviolet ray lamp 34 is installed over the guide belt 36 as the second embodiment of the present invention in order to better use the space around the wire bonding equipment 40.

Now, the semiconductor chip packaging method using the semiconductor chip packaging system according to the second embodiment of the present invention will be described.

First, the PCB 1 on which the semiconductor chips 3 are die-attached through the die attached process is taken out from the PCB magazine 35 and loaded on the guide belt 36. In this case, the guide belt 36 is rotated at a predetermined speed by operation of a driving unit so that the PCB 1 on the guide belt 36 can be rapidly conveyed toward the wire bonding equipment 40.

When the PCB 1 arrives under the lamp box 33, the driving unit is stopped and the PCB 1 stays under the lamp box 33.

Under this condition, an ultraviolet ray cleaning process is performed in the fabrication line in such a manner that an ultraviolet ray is ejected from the ultraviolet lamp 34 to the PCB 1 for a predetermined time, for example, for 1 to 2 minutes. Then, the contamination materials generated during the die attaching process are mostly removed from the PCB. Therefore, when assembly is completed through the subsequent processes, problems of wire delamination and delamination of molded objects from the PCB 1 can be prevented.

The ultraviolet ray used in the ultraviolet ray cleaning process has a wavelength corresponding to, for example, ⅓ of a visible ray, and an intensity of 70 mmJ/cm$^2$ to 90 mmJ/cm$^2$.

As described above, when an ultraviolet ray is used in cleaning the PCB 1, vacuum condition is not necessary in the production line. Therefore, the guide belt 36 for interconnecting the first PCB cleaning tool 30 and the wire bonding equipment 40 in-line can be freely installed. This results in an in-line arrangement of the first PCB cleaning tool 30 and the wire bonding equipment 40.

On the other hand, when the ultraviolet ray cleaning process is completed, the driving unit is operated again to restart the rotation of the guide belt 36. Thereby, the PCB 1 on the guide belt 36 can be safely loaded on the loading part of the wire bonding equipment 40.

At this time, since the first cleaning tool 30 and the die attaching equipment 40 are arranged in-line, the PCB 1 can be introduced into the wire bonding process immediately after cleaned. Therefore, the long time standby problem before introduced into the wire bonding equipment 40 can be solved.

Accordingly, the time difference between cleaning and wire bonding is considerably reduced and the cleaned state of the PCB 1 can be kept longer after cleaned. As a result, the problems of the PCB 1, i.e., a rapid moisture absorption problem and an easy contamination problem can be easily solved.

Moreover, in the case that the present invention is accomplished, the cleaned PCB 1 can be automatically conveyed and loaded on the wire bonding equipment 40 and an extra operator in charge of the cleaning process is not necessary.

Continuously, the wire bonding equipment 40 performs a wire bonding process in such a manner that the die-attached semiconductor chips 3 are connected to the leads of the PCB 1 via wires. Thereafter, the wire bonded PCBs 1 are loaded in the PCB magazine 35 and transferred to the following process, e.g., a molding process in the production line.

Figure 4:
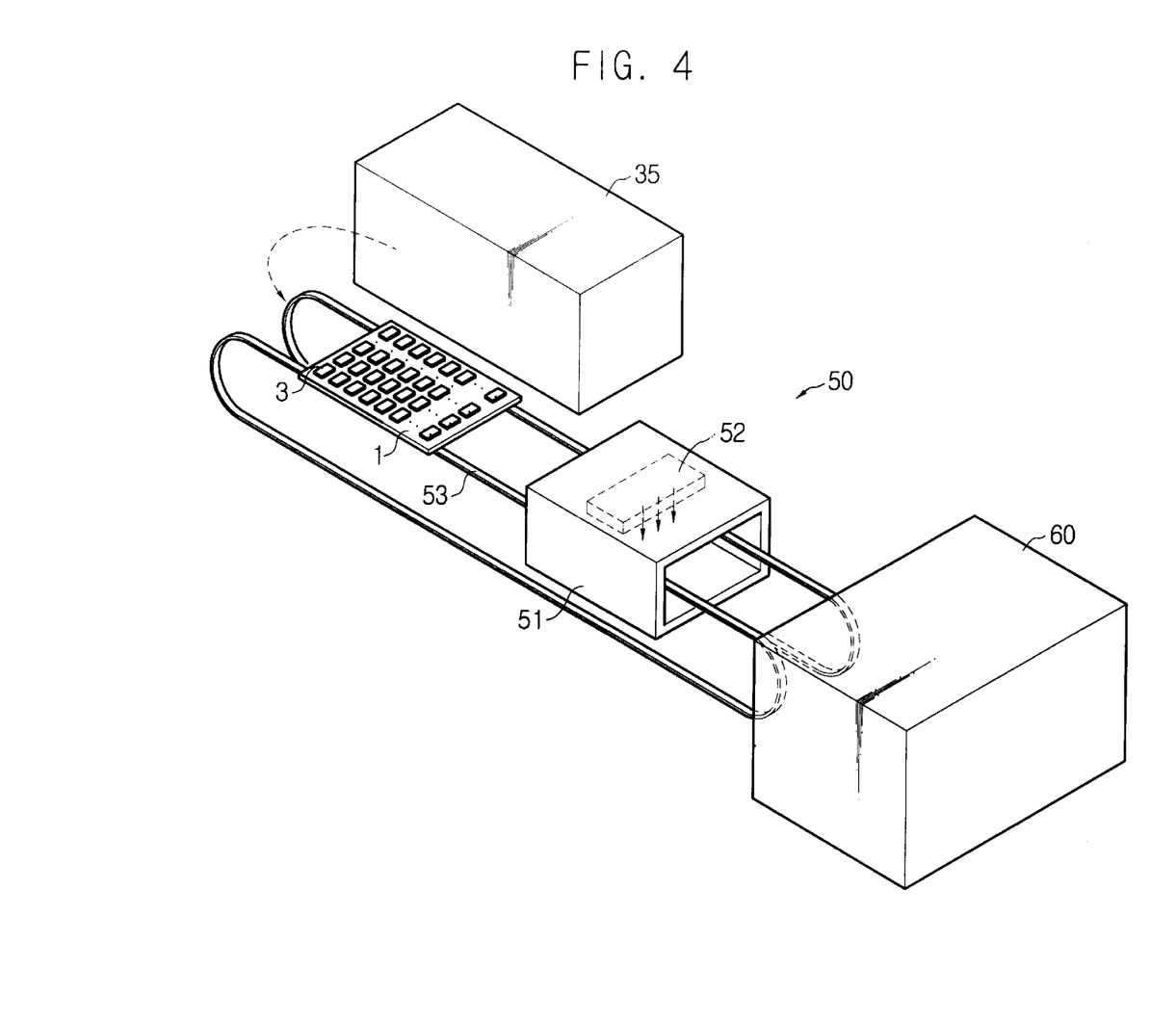
FIG. 4 is perspective view of a semiconductor chip packaging system according to still another embodiment of the present invention.

A semiconductor chip packaging system according to still another embodiment of the present invention arranged in the area C of FIG. 1 includes: a molding equipment 60 including a loading part and an unloading part, for molding the wire bonded semiconductor chips 3 with a molding resin; and a second PCB cleaning tool 50 arranged in the loading part of the molding equipment 60 in-line.

At this time, the second PCB cleaning tool 50 automatically transfers the PCB 1, supplies the PCB 1 with an ultraviolet ray to remove the contamination materials on the PCB 1, and loads the contamination material removed PCB 1 on the loading part of the molding equipment 60.

As shown in the drawing, the second PCB cleaning tool 50 includes a guide belt 53 and an ultraviolet ray lamp 52 arranged over the guide belt 53.

The guide belt 53 has an end connected to the loading part of the molding equipment 60 and conveys the wire bonded PCB 1 to the loading part of the molding equipment 60.

The ultraviolet ray lamp 52 is arranged over a predetermined point of the guide belt 53 and supplies the PCB 1 with an ultraviolet ray to remove contamination materials on the PCB 1 when the PCB 1 stops for a predetermined time thereunder.

As shown in the drawing, the ultraviolet ray lamp 52 is installed on the upper side of a lamp housing 51 having a box-shaped rectangular frame to define a predetermined sized space therein. The front and back sides of the lamp housing 51 and opened so that the guide belt 52 can pass through the opened front and back sides.

Differently from the wire bonding equipment 40, there is enough space for installation of another structure around the molding equipment 60. Accordingly, even though the ultraviolet ray lamp 52 is installed in the lamp housing 51 which occupies a relatively large space as in the embodiment of FIG. 4, the fabrication line is not influenced.

Now, the semiconductor chip packaging method using the semiconductor packaging system of FIG. 4 will be described.

First, the semiconductor chip wire bonded PCB 1 through the wire bonding process is outlet from the PCB magazine 35. Then, the PCB 1 is loaded on the guide belt 53. In this case, the guide belt 53 is rotated at a predetermined speed by operation of the driving unit so that the PCB 1 loaded on the guide belt 53 can be rapidly conveyed toward the molding equipment 60.

When the PCB 1 arrives in the lamp housing 51, the guide belt 53 is stopped by stopping the operation of the driving unit.

Under this condition, an ultraviolet cleaning process is performed in the fabrication line in such a manner that an ultraviolet ray is ejected from the ultraviolet lamp 52 to the PCB 1 for a predetermined time, for example, for 1 to 2 minutes. Then, the contamination materials generated during the wire bonding process are mostly removed from the PCB. Therefore, when fabrication is completed through the following processes, problems of delamination of molded objects from the PCB 1 can be prevented.

The ultraviolet ray used in the ultraviolet ray cleaning process has a wavelength corresponding to, for example, $1/3$ of a visible ray, and an intensity of 70 mmJ/cm$^2$ to 90 mmJ/cm$^2$.

As described above, when an ultraviolet ray is used in cleaning the PCB 1, vacuum condition is not necessary in the fabrication line. Therefore, the guide belt 53 for interconnecting the second PCB cleaning tool 50 and the molding equipment 60 can be freely installed. This results in an in-line arrangement of the second PCB cleaning tool 50 and the molding equipment 60.

First, the semiconductor chip wire bonded to PCB 1 through the wire bonding process is unloaded from the PCB magazine 35. Then, the PCB 1 is loaded on the guide belt 53. In this case, the guide belt 53 is rotated at a predetermined speed by operation of the driving unit so that the PCB 1 loaded on the guide belt 53 can be rapidly conveyed toward the molding equipment 60.

At this time, since the second PCB cleaning tool 50 and the molding equipment 60 are arranged in-line, the PCB 1 can be introduced into the molding process immediately after cleaned. Therefore, the long standby time problem before being introduced into the molding equipment 60 can be solved.

Moreover, in the case that the present invention is accomplished, the cleaned PCB 1 can be automatically conveyed and loaded on the molding equipment 60 and an extra operator in charge of the cleaning process is not necessary.

Continuously, the molding equipment 60 performs a molding process in such a manner that the PCB 1 is molded with a molding resin so that the wire bonded semiconductor chips 3 can be covered. Thereafter, the molded PCBs 1 are loaded in the PCB magazine 35 and transferred to the following process, e.g., a singulation process. Through singulation equipment 70 as shown in FIG. 1, the PCBs 1 are individually separated. This is a finished semiconductor chip package.

As described above, the present invention provides an improved PCB cleaning method and allows an in-line arrangement of cleaning equipment and fabricating equipment so that cleaned PCB can be introduced into the fabricating equipment immediately after cleaned. Therefore, the cleaned state of the PCB can be maintained longer.

In the case that the ultraviolet ray is used in cleaning the PCB, the environment around the ultraviolet ray lamp should not be under vacuum condition. Therefore, the guide belt for conveying the PCB can be freely installed and extended to connect the ultraviolet ray cleaning tool to the fabricating equipment. This results in an in-line arrangement of the ultraviolet ray cleaning chamber and fabricating equipment.

In the case that the ultraviolet ray cleaning chamber and the fabricating equipment are arranged in-line according to the present invention, cleaned PCBs can be immediately introduced into a fabricating process along the guide belt. Therefore, it is possible to solve the problem that PCBs are held outside the fabricating equipment for long time.

The present invention achieves same effects in various semiconductor fabricating processes using PCBs as well as in the above-described BGA and FBGA package fabricating process.

This invention has been described above with reference to the aforementioned embodiment. It is evident, however, that many alternatives, modifications and variations will be apparent to those having skill in the art in light of the foregoing description. Accordingly, the present invention embraces all such alternatives, modifications and variations as fall within the spirit and scope of the appended claims.

What is claimed is:

1. A semiconductor chip packaging system comprising:
    package assembly equipment including a loading part and an unloading part, the package assembly equipment being used in manufacturing a semiconductor package that includes a printed circuit board (PCB); and
    a PCB cleaning tool that uses an ultraviolet ray to clean the PCB before the PCB is transported to the loading part of the package assembly equipment.

2. The semiconductor chip packaging system of claim 1, wherein said package assembly equipment is any one of a wire bonding equipment and a molding equipment.

3. The semiconductor chip packaging system of claim 1, wherein the PCB cleaning tool comprises:
    a guide belt connected to the loading part of package assembly equipment so as to transport the PCB to the loading part; and
    an ultraviolet ray lamp that irradiates the ultraviolet ray to the PCB.

4. The semiconductor chip packaging system of claim 3, wherein the ultraviolet ray lamp is installed in a lamp housing including opened front and back sides such that the guide belt passes through the lamp housing.

5. The semiconductor chip packaging system of claim 3, wherein the ultraviolet ray lamp is installed in a lamp box which is arranged over the guide belt and moves up and down.

6. A semiconductor chip packaging system comprising:

die attaching equipment including a loading part and an unloading part that attaches a semiconductor chips to a PCB; and a PCB drying and cleaning tool that uses an ultraviolet ray to clean the PCB before the PCB is transported to the loading part of the die attaching equipment and supplies heat to remove moisture in and on the PCB, wherein the PCB cleaning tool is arranged in-line with the die attaching equipment.

7. The semiconductor chip packaging system of claim 6, wherein the PCB drying and cleaning tool comprises:

a guide belt connected to the loading part of the die attaching equipment so as to transport the PCB to the loading part;

a dry housing that supplies the heat to the PCB when the PCB passes through the dry housing, the dry housing having opened front and back sides such that the guide belt passes through the dry housing; and a lamp housing including an ultraviolet ray lamp installed therein, the lamp housing having opened front and back sides such that the guide belt passes through the lamp housing, wherein the ultraviolet ray irradiates the ultraviolet ray on the PCB.

8. The semiconductor chip packaging system of claim 7, wherein the dry housing comprises a plurality of dry housings spaced apart from each other.

9. The semiconductor chip packaging system of claim 7, further comprising a cleaning air fan that blows air to clean the PCB before the PCB is introduced into the dry housing.

10. The semiconductor chip packaging system of claim 7, further comprising a cooling air fan that blows air to cool down the PCB before the PCB is loaded on the die attaching equipment.

11. A semiconductor chip packaging method comprising:

a pre-treatment step of providing a semiconductor chip;

a die attaching step of attaching the semiconductor chip to a die pad of a printed circuit board (PCB);

a wire bonding step of electrically connecting bonding pads of the die attached semiconductor chip to leads of the PCB; and a molding step of molding the PCB with a molding resin to cover the wire bonded semiconductor chip, wherein an ultraviolet ray cleaning step of cleaning the PCB using an ultraviolet ray is performed prior to performing the die attaching, wire bonding, or molding step.

12. The semiconductor chip packaging method of claim 11, wherein the ultraviolet ray cleaning step is performed for 1 to 2 minutes.

13. The semiconductor chip packaging method of claim 12, wherein the ultraviolet ray used in the ultraviolet ray cleaning step has a wavelength corresponding to ⅓ of a visible ray.

14. The semiconductor chip packaging method of claim 13, wherein the ultraviolet ray used in the ultraviolet ray cleaning step has an intensity of 70 mmJ/cm$^2$ to 90 mmJ/cm$^2$.

15. The semiconductor chip packaging method of claim 11, when the ultraviolet ray cleaning step is performed before the die attaching step, further comprising a drying step of drying the PCB.

16. The semiconductor chip packaging method of claim 15, wherein the drying step is performed for 5 to 10 minutes.

17. The semiconductor chip packaging method of claim 15, wherein the drying step is performed at a temperature of 100° C. to 170° C.

18. The semiconductor chip packaging method of claim 15, further comprising an air cleaning step of cleaning the PCB by supplying a cleaning air to the PCB prior to performing the drying step.

19. The semiconductor chip packaging method of claim 18, wherein the cleaning air is $N_2$.

20. The semiconductor chip packaging method of claim 18, wherein the air cleaning step is performed for 30 to 60 seconds.

21. The semiconductor chip packaging method of claim 11, when the ultraviolet ray cleaning step is performed prior to performing the die attaching step, further comprising a cooling step of cooling the PCB by supplying a cooling air to the PCB after the ultraviolet ray cleaning step is performed.

22. The semiconductor chip packaging method of claim 21, wherein the cooling air is $N_2$.

23. The semiconductor chip packaging method of claim 21, wherein the cooling step is performed for 30 to 60 seconds.

* * * * *